US006833314B2

(12) United States Patent
Maleville et al.

(10) Patent No.: US 6,833,314 B2
(45) Date of Patent: Dec. 21, 2004

(54) METHOD OF CHARACTERIZING IMPLANTATION OF A SPECIES IN A SUBSTRATE BY SURFACE IMAGING

(75) Inventors: Christophe Maleville, La Terrasse (FR); Walter Schwarzenbach, Saint-Nazaire-les-Eymes (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/809,918

(22) Filed: Mar. 26, 2004

(65) Prior Publication Data

US 2004/0209449 A1 Oct. 21, 2004

Related U.S. Application Data

(63) Continuation of application No. PCT/FR02/03281, filed on Sep. 26, 2002.

(30) Foreign Application Priority Data

Sep. 28, 2001 (FR) .............................. 01 12507

(51) Int. Cl.$^7$ .............................. H01L 21/425
(52) U.S. Cl. ...................................... 438/530; 438/514
(58) Field of Search ............................... 438/530, 510, 438/514, 515, 517, 518, 522

(56) References Cited

U.S. PATENT DOCUMENTS

| | | | |
|---|---|---|---|
| 4,743,767 A | 5/1988 | Plumb et al. | ............ 250/492.2 |
| 4,751,393 A | 6/1988 | Corey, Jr. et al. | ....... 250/492.21 |
| 4,807,994 A | 2/1989 | Felch et al. | .................. 356/326 |
| 5,374,564 A | 12/1994 | Bruel | .......................... 437/24 |
| 5,760,409 A | 6/1998 | Chen et al. | ............ 250/492.21 |
| 5,998,798 A | 12/1999 | Halling et al. | ......... 250/492.21 |

FOREIGN PATENT DOCUMENTS

JP 61 043417 A 3/1986
WO WO 99 08307 A 2/1999

OTHER PUBLICATIONS

Scott M. Baumann, Rutherford Backscattering Spectrometry (RBS), Charles Evans & Associates, Specialists in Materials Characterization, pp. 1–15.
Shiettekatte et al., XP004195210, "Dose and implantation temperature influence extended defects nucleanon in c–Si", Nuclear instruments and methods in physics research, section B: beam interactions with materials and atoms, North–Holland Publishing Company, vol. 164–165, pp. 425–430 (2000).
L.J. Huang et al., XP000905645, "Model for blistering of hydrogen implanted silicon and its application to silicon–on–quartz", Electrochemical Society Proceedings, Processing of 8th International Symposium on Semiconductor Silicon Vol 98–1, pp. 1373–1384 (1998).
Bruel et al., XP000611125, "Application of Hydrogen Ion Beams to Silicon on Insulator Material Technology", Nuclear instrument and methods in physics research, section B: beam interactions with materials and atoms, North–Holland Publishing Company, Amsterdam, NL, vol. 108, No. 3, pp. 313–319 (1996).
Lanzieri et al., XP000073904 "Activation Uniformity Improvement of Undoped semi–insulatiing Gaas with an improved Post–Implant Anneal Furnace", Journal of applied Physics, New York, vol. 66, No. 8, pp 3643–3646 (1989).

*Primary Examiner*—Michael S. Lebentritt
*Assistant Examiner*—Beth E. Owens
(74) *Attorney, Agent, or Firm*—Winston & Strawn LLP

(57) ABSTRACT

A method for characterizing a dose or dosage of implanted atomic species in a substrate by annealing the substrate after implantation of the atomic species, with the anneal conducted at a temperature and for a time sufficient to cause the implanted atomic species to from blisters in a surface region of the substrate but below that which would cause a majority or significant amount of the blisters to burst; imaging the surface region of the substrate to obtain a surface image; and processing the surface image to characterize the implant dose of the atomic species. This characterization can be performed on a qualitative or quantitative basis, as desired.

20 Claims, 2 Drawing Sheets

Surface after implanting

Annealing duration

METHOD OF CHARACTERIZING IMPLANTATION OF A SPECIES IN A SUBSTRATE BY SURFACE IMAGING

CROSS-REFERENCE TO RELATED APPLICATIONS

This application is a continuation of International application PCT/FR02/03281 filed Sep. 26, 2002, the entire content of which is expressly incorporated herein by reference thereto.

BACKGROUND

The present invention relates to operations for characterizing the processing to which a substrate of material is subjected. More precisely, the invention relates to a method for characterizing dosage in a step of implanting one or more atomic species in a substrate. The substrate is generally a semiconductor material such as silicon.

The term "species" or "atomic species" as used herein means any type of ion or atom that can be implanted into a substrate. As explained below, in the most preferred application of the invention, the species is $H^+$ ions and/or hydrogen atoms H.

By way of example, one way of implanting species (ions or atoms) into a material substrate is to expose the surface of the substrate to bombardment by the species. As a function of the energy associated with the bombardment, and as a function of the nature of the species being implanted, the atomic species becomes implanted in the mass of the substrate with a distribution that presents a well-marked maximum at a given depth. This establishes a concentration maximum for the implanted species at a given depth in the substrate.

For any given species, it is possible to vary this implantation step by controlling implantation energy. An example of a method that implants atomic species in an implementation step is described in U.S. Pat. No. 5,374,564, where the implantation step is used for fabricating a thin film or layer of a semiconductor material. One such method according to the teaching of that patent is known as the SMART-CUT® method. In that method, the implantation step is intended to define a plane of weakness in a substrate typically made of a semiconductor material such as a silicon single crystal. A subsequent step in the method is a cleaving step for at least partially fracturing the plane of weakness as defined by the layer of implanted species.

Thus, in SMARTCUT® type methods, the implantation step defines the plane of weakness. Depending upon the implantation characteristics and in particular the implantation dose, cleavage can be achieved more or less easily. In addition, the implantation determines to some extent the roughness of the wafer surface after cleavage.

It has thus been observed in the context of the SMART-CUT® method, that it would be desirable to be able to characterize the dose of species implanted in a material substrate. This need also applies to implanting species in other contexts. In general, it would thus be desirable to be able to characterize two important parameters of implantation, namely:

the dose of species implanted in the substrate; and
the uniformity of implantation in the substrate, at different points over the surface of said substrate.

Methods and apparatuses are known which provide at least partial responses to this need. One method is known which consists in performing in situ measurements, i.e. measurements in real time during implantation, of the dose of species being implanted. For example, U.S. Pat. No. 4,743,767 discloses means for measuring an electric current that is representative of implantation. The method implemented in that patent is based on performing an electrical measurement on a beam of charged particles with which it is desired to implant substrates.

A first drawback of that method is that it does not make it possible to measure electrically neutral species that might be implanted in substrates. Unfortunately, even when implanting species that are initially charged (e.g., $H^+$ ions), at least some of the species can come into collision with residual elements present in the implantation chamber (atoms and/or molecules of oxygen or nitrogen, for example) and lose their electric charge. Such species that have become electrically neutral can nevertheless conserve sufficient energy to become implanted in the substrate, and the above-mentioned method does not enable them to be taken into account.

Similarly, that method does not make it possible to take account in representative manner of species in which the electric charge is transformed in some way. This applies for example to $H_2^+$ ions which, having a ratio of mass divided by electric charge double that of an $H^+$ ion, are each counted as being a single ion by such a method, whereas the actual dose that is implanted is twice that. In addition, such a method does not enable uniformity of implantation to be characterized.

There also exist in situ measurement methods which propose solutions to some of the above-mentioned drawbacks. For example, U.S. Pat. No. 4,751,393 describes a method enabling point measurements to be interpolated in order to provide at least partial information concerning uniformity of implantation. Furthermore, U.S. Pat. No. 5,998,798 proposes mitigating the absence of neutral particle measurement to some extent by compensation. However such attempts take account only of one of the above-mentioned drawbacks concerning in situ methods. In addition, the responses provided are imperfect (mere interpolation for uniformity, and a posteriori compensation for measuring neutral particles—instead of directly measuring the implantation of such neutral particles).

Another known method consists in measuring the characteristics of implantation ex situ, i.e., after the implantation step has been performed. A first method of this type consists in performing annealing after implantation, with the annealing parameters being controlled so as to "fix" the implanted species in the structure of the substrate. Following such annealing, the implanted substrate is characterized electrically in such a manner as to measure the implanted dose of species.

A major limitation of that type of method is that it is not suitable for measuring the implantation dose of lightweight species such as hydrogen (or indeed helium). That limitation is particularly penalizing for characterizing implantation by means of a light ion such as hydrogen, which corresponds to a preferred application of a SMARTCUT® type method.

In a second method of taking measurements ex situ, the surface layer of the implanted substrate is characterized optically. U.S. Pat. Nos. 5,834,364 and 4,807,994 are illustrations of such a method. However, in that case also, the method is adapted to measuring implantation with heavy ions such as phosphorus or boron, and is poorly adapted to measuring implantation with light ions such as hydrogen. Furthermore, implementing that method requires specific equipment (e.g., of the THERMAPROBE® type).

Also, U.S. Pat. No. 4,807,994 is also limited to measuring uniformity of implantation. Furthermore, that document discloses a method limited to characterizing relatively small implantation doses, whereas the implantation doses used in a method of the SMARTCUT® type are typically greater than $10^{16}$ atoms per square centimeter ($cm^2$).

In a third ex situ method of measurement, it is known to analyze the reflected portion of a single-energy beam of high energy particles directed against a previously-implanted substrate in order to establish a profile of implantation in a surface layer of the substrate. A description of such a method is to be found in the article "Rutherford backscattering spectrometry (RBS)" by Scott M. Baumann, published by Charles Evens & Associates, 810 Kifer Road, Sunnyvale, Calif., USA.

A first limitation of such a method is that it is ill-suited to characterizing uniformity of implantation. To do that it would be necessary to proceed with a multitude of point-by-point measurements, which would be tedious and expensive. In addition, the thickness of the substrate layer that can be characterized in that way remains limited. Finally, the precision of measurements obtained by that type of method is no better than to within 5%, which is not sufficient in certain applications.

Finally, a fourth ex situ method of measurement consists in using an energy beam to etch the surface of an implanted substrate and then analyzing the substrate as etched in depth. One such method is known as secondary ion mass spectrometry.

A first drawback of that type of method is that it too is poorly adapted to characterizing uniformity of implantation. In addition, that method is very expensive to implement.

It can thus be seen that although various methods do indeed exist making it possible, to some extent, to characterize the dose of species that have been implanted or the uniformity of implantation, there nevertheless remains a need for a method that is fast and simple and that makes it possible characterize both aspects simultaneously, while avoiding the drawbacks mentioned above.

It is also specified that it has already been possible to show up the influence of various parameters of an implantation step on the structure of an implanted substrate. In this regard, there exists an article by L. J. Huang et al., "Model for blistering of hydrogen implanted silicon and its application to silicon-on-quartz", Electrochemical Society Proceedings, Processing of 8th International Symposium on Semiconductor Silicon {Vol. 98-1, May 4-8, 1998, pp. 1373-1384}. However, that article does no more than observe a resultant effect on the substrate after implantation as a function of various different implantation parameters. Under no circumstances does that article suggest the converse, i.e., making use of an observation of said resultant effect to characterize the implanted dose.

It should also be observed that when it comes to characterizing implantation dose, that article discloses a method of observing the implanted substrate that is relatively expensive to implement (transmission electron microscope (TEM) type observation seeking to provide a section image through the depth of the substrate).

Other documents are also known which characterize to some extent the influence of an implantation dose on the characteristic of the implanted substrate. By way of example, mention can be made of an article by Shiettekatte et al. "Dose and implantation temperature influence extended defects nucleation in c-Si", Nuclear instruments and methods in physics research, section B: beam interactions with materials and atoms, North-Holland Publishing Company, Vol. 164-165, April 2000 (2000-04), pp. 425-430. However, in that case also, the article does no more than observed that effects exist that are the result of variations in various implantation parameters, and it does not suggest any way of making use of such observations for characterizing implantation parameters themselves. In addition, that method is likewise relatively expensive, being of the TEM type, and it is used to observe the implanted substrate: in the context of that article, it is "extended defects" buried in the thickness of a substrate that are observed. Finally, it should be observed that that article sets out to characterize the influence of implantation temperature, and is not in any way focused on the influence of implantation dose.

Mention is also made of an article by Da Silva et al., "The effects of implantation temperature on He bubble formation in silicon", Nuclear instrument and methods in physics research, section B: beam interactions with materials and atoms, North-Holland Publishing' Company, Amsterdam, NL, Vol. 175-177, April 2001 (2001-04), pp. 335-339. In that article also, there is no suggestion of making use of the observations performed to characterize implantation dose. Furthermore, the methods used for observing the in-depth structure of the implanted substrate are expensive, being of the TEM or the RBS type, and the article focuses solely on the influence of implantation temperature and does not consider aspects associated with dose. It should also be observed that the annealing to which the substrate is subjected in the context of that article is of the rapid thermal annealing (RTA) type, whereas, as explained below in the context of the present invention, it is desirable to avoid annealing temperatures that are too high.

It can thus be seen that the documents mentioned above seeking to observe the influence of various characteristics of an implantation step on an implanted substrate do not satisfy the above-mentioned need. The present invention now provide improvements over known methods in this area.

SUMMARY OF THE INVENTION

The invention relates to a method for characterizing a dose or dosage of implanted atomic species in a substrate. The method comprises annealing the substrate after implantation of the atomic species, with the anneal conducted at a temperature and for a time sufficient to cause the implanted atomic species to from blisters in a surface region of the substrate but below that which would cause a majority or at least a significant amount of the blisters to burst; imaging the surface region of the substrate to obtain a surface image; and processing the surface image to characterize the implant dose of the atomic species. This characterization can be performed on a qualitative or quantitative basis, as desired.

For example, the density and size of the blisters may be analyzed or calculated. In an embodiment, the surface image is obtained by a charge coupled device and the implant dose is characterized by a density parameter. In another embodiment, the blister area may be calculated. These calculations allow the implantation dose to be calibrated, prior to annealing, to obtain a desired density or size of blisters to be obtained in the substrate.

The dose of implanted atomic species may be calculated from blister density parameters or by comparing the processed surface image to images of known implanted doses of atomic species. Also, compensation factors may be established for implantation dose measurements by comparison of the processed image to reference implantation data. The compensation factor may be applied to an implanter to obtain improvements in subsequent implanted doses. Also, the compensation factor may also be determined by balancing implantation operations performed by different implanters that are used to implant the atomic species.

On the qualitative side, the spatial distribution of the blisters from the processed image may be analyzed to determine uniformity of implantation of the atomic species. Different blister measurements can be performed on different locations on the substrate so as to obtain a spatial distribution of the dose over the surface of the substrate. Furthermore, such measurements can be made on a plurality of substrates which have been annealed under the same conditions but with different orientations in order to determine local temperature effects. The processed image may also be observed to characterize the uniformity or thickness of the implanted dose of atomic species. Such uniformity may be determined by establishing regions of the substrate that have received a dose of atomic species per unit area that differ from a mean dose of atomic species that is received by the substrate.

Preferably, the atomic species that is implanted comprises hydrogen or helium and the implantation is conducted at a dose of greater than $10^{16}$ atoms per square centimeter, the substrate is a semiconductor material such as silicon and the annealing is conducted for a time of between about 5 and 20 minutes at a temperature of between 300 and 550° C.

BRIEF DESCRIPTION OF THE DRAWING FIGURES

Other aspects, objects, and advantages of the invention appear better on reading the following description of an embodiment of the invention, given with reference to the accompanying drawings, in which.

Figure 3:
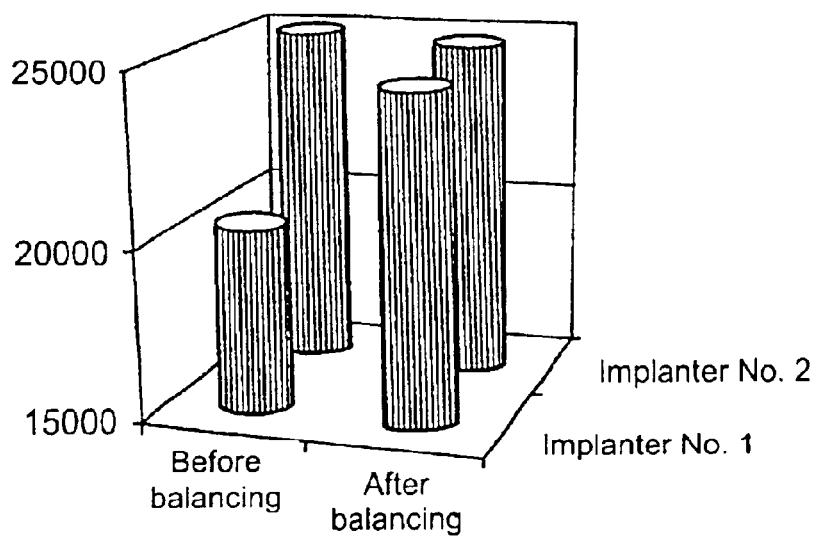
Figure 4:
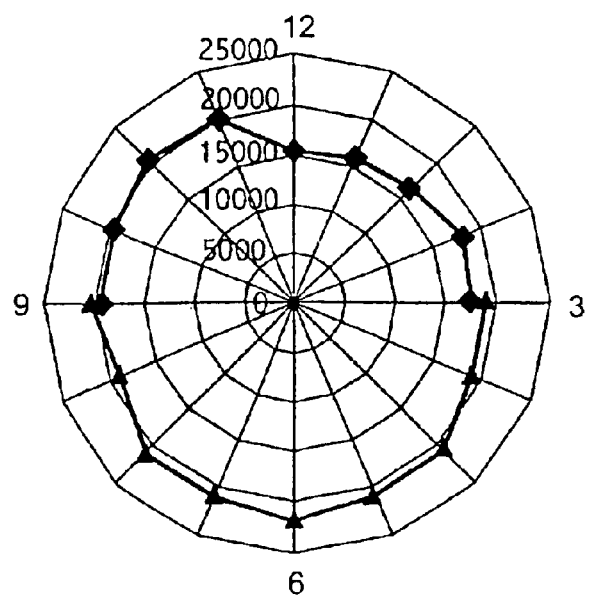

FIG. 3 is a graph showing the effect of an application of the invention which consists in establishing implanter compensation factors, on the basis of implantation dose measurements performed in accordance with the invention; and FIG. 4 is a graph showing the result of measurements of the spatial distribution of blister density over the surface of a wafer, in various different measurement directions.

DETAILED DESCRIPTION OF THE PREFERRED EMBODIMENTS

The characterization method of the invention is an ex situ method of characterization, i.e., it enables an implantation step that has already been performed in a substrate to be characterized in terms of various parameters that are specified below.

More precisely, as explained below, the method of the invention makes it possible to characterize implantation dose.

This characterization can be quantitative and/or qualitative.

The term "quantitative characterization" is used to mean determining the value of the implanted dose.

The term "qualitative characterization" is used to characterize the spatial uniformity of the dose implanted in the substrate: this second type of characterization thus concentrates on identifying regions of the substrate that have received a dose per unit area that is greater than or less than the mean dose received by the substrate.

The term "implanter" is used to designate the apparatus used for implanting the substrate. It may be any known type of implanter.

As mentioned above, in a preferred implementation of the invention, the substrate is a semiconductor material such as a silicon single crystal, and the implantation species is hydrogen. Nevertheless, the substrate material and the implanted species may be different; for example it is possible in this way to characterize a silicon substrate implanted with helium.

Starting thus with a substrate that has already been implanted, the characterization method of the invention comprises the following main steps:

an annealing step for causing the species to blister in the implanted substrate;

a step of acquiring an image of the surface of the substrate; and a step of processing the image, with the implantation dose characteristics being deduced from the image processing step.

The annealing step is performed at a temperature and for a duration that are controlled so as to cause hydrogen blisters to form in the surface region of the substrate. The term "blister" is used in this specification, but some authors use the equivalent term "bubble" instead.

Figure 1:
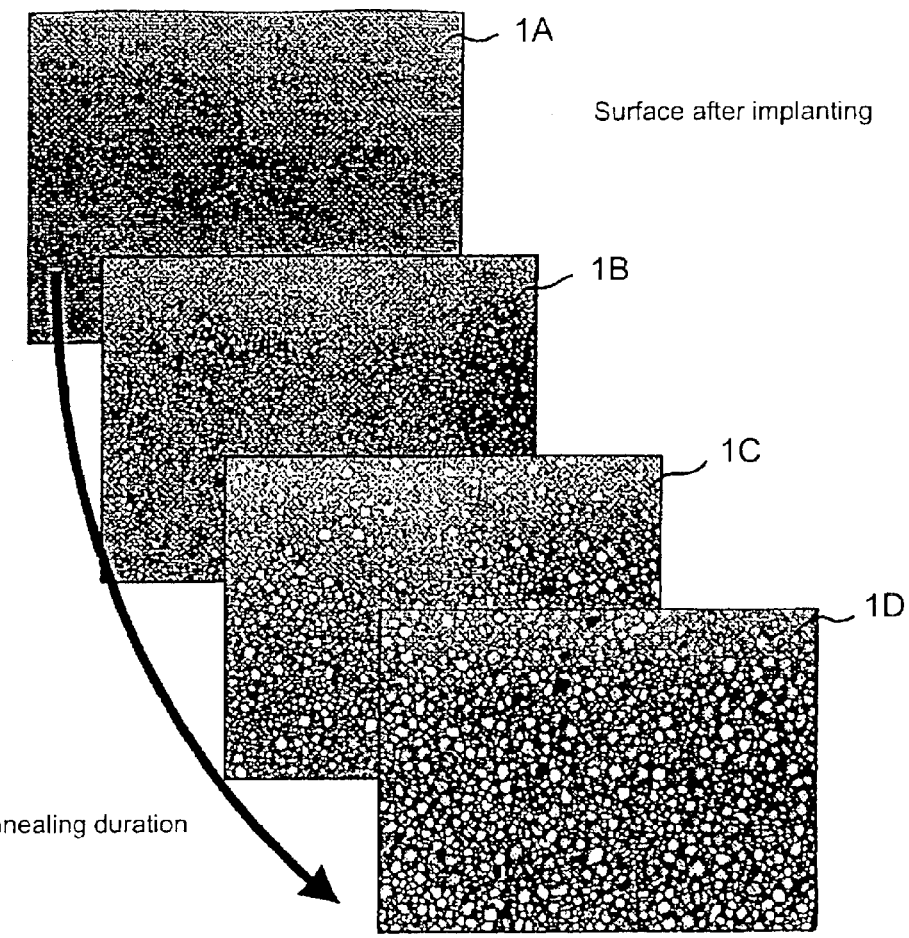
FIG. 1 shows four successive views of the surface of the same substrate that has previously been implanted, the four views corresponding to four stages of annealing as performed in accordance with the invention, thus forming a time sequence illustrating how the surface appearance of the substrate varies during annealing.

The effect of such annealing on an implanted substrate is illustrated by FIG. 1 in which the four successive views show how the surface appearance of an implanted substrate (IA) varies, with blisters appearing at the surface thereof during annealing (IB and IC in succession as annealing takes place), all the way to a state in which the "blistering" phenomenon is practically completed (ID). The annealing whose effects are shown in FIG. 1 was performed at a temperature of 440° C. but this example temperature is not limiting. It merely illustrates a value which corresponds to a good compromise in the preferred application of the invention. Generally, temperatures of between 300 and 550° C. can be used.

This annealing temperature needs to be defined so as simultaneously:

to be high enough to encourage blistering which requires a certain heat budget (said budget depending essentially on the temperature and the duration of annealing); and to avoid exceeding an upper limit value beyond which the heat budget becomes excessive, causing certain blisters that are formed during blistering to burst, which prevents good characterization being performed.

By controlling the temperature and duration parameters of annealing, it is possible to cause the implanted hydrogen to blister to a greater or lesser extent (while ensuring that the blisters do not burst). While it is most preferred that no blisters burst prior to processing the image, at a minimum a majority of the blisters should not burst. As long as the number of burst blisters is below that which would significantly interference with the processing of the image, some burst blisters can be tolerated. Of course, the grater then amount of blisters that burst, the greater the possibility that portions of the surface can be detached, cleaved or removed.

Figure 2:
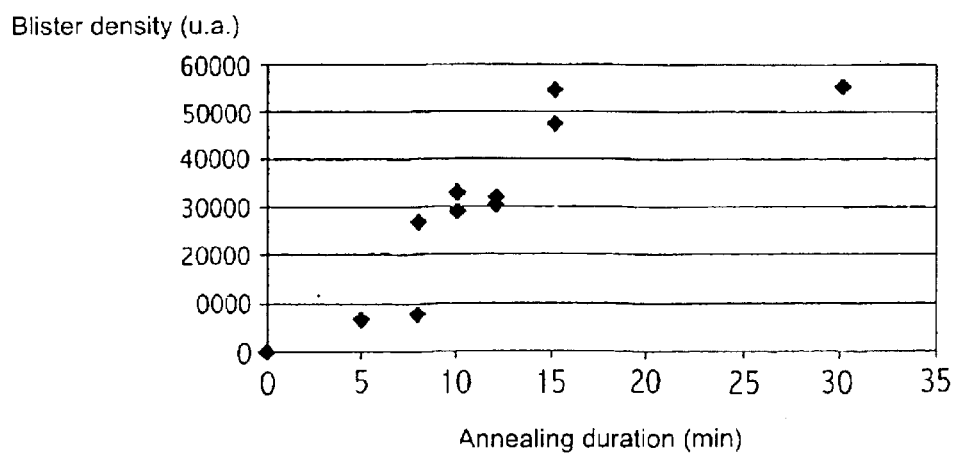
FIG. 2 is a graph showing how the density of blisters generated by annealing varies as a function of annealing duration.

FIG. 2 shows how a parameter representative of the blister density per unit area of substrate (plotted up the ordinate) varies as a function of annealing duration (plotted along the abscissa) with annealing taking place at a determined temperature.

Specifically, this figure relates to the same annealing as the annealing whose effects are shown in FIG. 1. This density parameter is obtained by processing an image of the surface of the substrate after annealing, with the image being acquired by means such as a charge coupled device (CCD) sensor. This parameter is typically associated with the number of pixels corresponding to blister area in the field of view of a microscope.

The density parameter is associated in particular with the following factors:

the discrimination threshold used in the processing of the microscope image;

the size and the definition of the image;

the duration and the temperature of annealing; and the dose of hydrogen that was actually implanted in the substrate.

For those parameters that can be controlled (i.e., all of them apart from the implanted dose), operating values are defined and the resulting density value is used to determine the implanted dose.

To calculate the dose that has actually been implanted, calibration is performed initially in order to establish a relationship between the blister density parameter and the real dose (using a reference implanter and under reference conditions).

This calibration is performed by subjecting a substrate that has previously been implanted with a known dose to annealing in accordance with the invention, and then characterizing its blister area.

As described below in detail with reference to FIG. 4, it is also possible to analyze the spatial distribution of blister density in order to characterize the uniformity of implantation.

Returning to the definition of those parameters which can be controlled, an important parameter is annealing duration. FIG. 2 shows that:

for short durations of annealing (less than 5 minutes in the figure), the blistering effect does not develop;

there exists a range of intermediate durations (in the range 5 minutes to 15 minutes in the figure) over which blistering develops, increasing with time; and beyond a certain duration of annealing (about 15 minutes to 20 minutes in the figure), blistering is observed to "saturate" and does not progress any further.

In the context of the invention, it is preferable to select the duration of annealing (as a function of its temperature, of course) in such a manner that blistering is well developed, and has reached a stage immediately preceding saturation (thus about 15 minutes in the example of FIG. 2).

Firstly it is necessary to avoid annealing that is too short:

it is important to have blistering that is well developed so as to enable usable measurements to be made—and this requires a minimum duration as can be seen from FIG. 2; and also too short a duration of annealing exposes the substrate to local temperature effects in an annealing oven (hot/cold points . . . ) and these effects can be overcome by prolonging annealing.

While secondly it is nevertheless desirable to avoid prolonging annealing beyond the time required for saturation:

this is due to the fact that prolonging annealing excessively runs the risk of encouraging some of the blisters formed at the surface of the substrate to burst. In addition, an implanted substrate surface having some blisters that have burst is difficult to characterize because of discriminating visually between blisters that have burst, blisters that have not burst, and the background of the substrate.

A well-adapted annealing duration is thus a duration which is long enough to guarantee that blistering is well developed but has not gone beyond the saturation duration.

In a particular application of the invention, use is made of hydrogen dose measurements performed by processing an image of the substrate that has been annealed in order to determine compensation factors that need to be applied to various implanters.

When performing implantation on an industrial scale, it can be necessary to use a plurality of different implanters (even if they are all of the same design) for implanting substrates in parallel.

It is desirable to be able to control the operation of the various implanters on the basis of a single reference value that is given to each of them.

Unfortunately, two different implanters receiving the same reference value (i.e., both being instructed to implant the same doses), are likely to implant different doses in fact, even if they are both designed in the same way. Typically, differences that may be about 5% are to be observed. It is therefore helpful to select a reference implanter and to associate a compensation factor with each other implanter, thus enabling the reference value to be adapted individually to each implanter by multiplying the common reference value by the compensation factor so that of the implanters actually implant the same doses. The compensation factor is thus close to unity—and typically it may drop to a value that is as low as about 0.9. This operation of defining a compensation factor may be referred to as "balancing".

FIG. 3 shows measurements of doses actually implanted by two different implanters, the doses being measured in accordance with the invention, using the same annealing. More precisely, for each implanter, the dose prior to balancing is measured (two left-hand measurements in FIG. 3) and after balancing (two right-hand measurements in the figure). The ordinate defines a density parameter which represents the implanted dose.

It can be seen that prior to balancing, there is a significant difference in the density parameter between the implantation operations performed by the two respective implanters: this parameter has a value of 20,000 for implanter No.1, whereas its value is 24,000 for implanter No.2. This large difference in the density parameter corresponds to a difference of 1% in the doses actually implanted by the two implanters.

Thus, the density parameter is very sensitive to variations in dose, thus enabling it to detect small variations. In the example of FIG. 3, a difference of 1% is easily detected. This makes it possible to define a compensation factor for implanter No.1 using implanter No. 2 as the reference implanter. The right-hand side of FIG. 3 shows that after applying the compensation factor (i.e., after the reference value given to implanter No.1 has been multiplied by said compensation factor), both implanters do indeed implant the same doses.

It should be observed that the method of the invention thus makes it possible to determine an implantation dose to within accuracy of about 1% or better, which constitutes a significant improvement over known methods. The method of the invention thus provides the advantage of enabling an implantation dose to be determined with great accuracy.

Another advantage of the method is that it is simple to implement. In particular, observation of the implanted substrate involves observing a surface image, which can be performed using standard CCD type sensor means. This constitutes an additional difference compared with the techniques of the prior art since they use means that are generally expensive and complex in order to perform observations on an implanted substrate (these observations generally being performed through, the thickness of the substrate).

FIG. 4 shows another way of using the measured density parameter for the purpose of characterizing the uniformity of the dose implanted over the surface of a substrate. This application can be combined with the dispositions described above. FIG. 4 shows a measurement of the dose as really implanted—and as measured using the invention as described above—all around a substrate. It shows up under-implantation in the 12 o'clock to 2 o'clock sector. This measurement is a function of the heat budget as locally absorbed by the substrate during annealing. It therefore depends on temperature uniformity within the annealing oven.

To compensate for possible lack of temperature uniformity in the annealing oven, it is possible to cause the substrate to revolve during annealing. It is also possible to perform annealing on a plurality of identical substrates that have been implanted under the same conditions and in the same implanter (or by implanters that have been suitably compensated relative to one another, see above). Under such circumstances, where annealing is performed on a plurality of identical substrates, each substrate is given a different orientation in the annealing oven so as to overcome local temperature effects.

For example, in order to overcome the ortho-radial effect shown up by FIG. 4, the substrates should be disposed with angular orientations that are regularly distributed over the range 0° to 360°. The measurements performed on identical substrates that have been oriented differently in the annealing oven are then averaged. In general, when observing an individual measurement of spatial distribution of dose that reveals a local anomaly, it is appropriate to determine whether the anomaly is due to the annealing by suitably distributing identical substrates in a given oven so as to overcome local temperature effects, and then by averaging the measurements over the substrates. Once such techniques have been applied to obviate local effects in annealing ovens, it is possible to obtain an overall view of doses as implanted over the area of a substrate and thus to characterize uniformity of implantation.

The invention thus provides a method that is simple and inexpensive for characterizing implantation (annealing time, image acquisition, plus analysis by image processing together requiring less than 2 hours). Also, the invention does not require specialist equipment and it can be applied without specific adaptations on any type of implanted substrate.

What is claimed is:

1. A method for characterizing a dose of implanted atomic species in a substrate, which comprises:

annealing the substrate after implantation of the atomic species, with the anneal conducted at a temperature and for a time sufficient to cause the implanted atomic species to from blisters in a surface region of the substrate but below that which would cause a number the blisters to burst;

imaging the surface region of the substrate to obtain a surface image; and processing the surface image to determine the characteristics of the implanted dose of the atomic species.

2. The method of claim 1, wherein the characteristics of the implanted dose of the atomic species are quantitative characteristics.

3. The method of claim 2, wherein the surface image is observed to determine density or size of the blisters, or both density and size.

4. The method of claim 2, wherein the surface image is obtained by a charge coupled device and the implant dose is characterized by a density parameter.

5. The method of claim 2, wherein the surface image is observed to determine blister area.

6. The method of claim 1, wherein the blister density is calibrated as a function of implantation dose prior to annealing.

7. The method of claim 6, which further comprises calculating the implantation dose of atomic species by comparing the processed surface image to images of known implanted doses of atomic species.

8. The method of claim 1, which further comprises establishing compensation factors for implantation dose measurements by comparison of the processed image to reference implantation data.

9. The method of claim 8, wherein a compensation factor is applied to an implanter to obtain improvements in subsequent implanted doses.

10. The method of claim 8, wherein a compensation factor is determined by balancing implantation operations performed by different implanters that are used to implant the atomic species.

11. The method of claim 1, wherein the characteristics of the implanted dose of the atomic species are qualitative characteristics.

12. The method of claim 1, which further comprises analyzing spatial distribution of the blisters from the processed image to determine uniformity of implantation of the atomic species.

13. The method of claim 1, which further comprises performing blister measurements on different locations of the substrate surface so as to obtain a spatial distribution of the dose over the surface of the substrate.

14. The method of claim 1, which further comprises performing blister measurements on a plurality of substrates which have been annealed under the same conditions but with different orientations in order to determine local temperature effects.

15. The method of claim 1, wherein the processed image is observed to characterize the uniformity or thickness of the implanted dose of atomic species.

16. The method of claim 14, wherein the uniformity is determined by establishing regions of the substrate that have received a dose of atomic species per unit area that differ from a mean dose of atomic species that is received by the substrate.

17. The method of claim 1, wherein the atomic species that is implanted comprises hydrogen of helium and the implantation is conducted at a dose of greater than $10^{16}$ atoms per square centimeter.

18. The method of claim 1, wherein the annealing is conducted for a time of between about 5 to 20 minutes at a temperature of between 300 and 550° C.

19. The method of claim 1, wherein the substrate comprises a semiconductor material.

20. The method of claim 19, wherein the semiconductor material is a silicon single crystal.

* * * * *

UNITED STATES PATENT AND TRADEMARK OFFICE
CERTIFICATE OF CORRECTION

PATENT NO. : 6,833,314 B2  Page 1 of 1
DATED : December 21, 2004
INVENTOR(S) : Maleville et al.

It is certified that error appears in the above-identified patent and that said Letters Patent is hereby corrected as shown below:

Title page,
Item [56], References Cited, OTHER PUBLICATIONS,
"Shiettekatte et al." reference, delete "Shiettekatte" and insert -- Schiettekatte --; after "temperature influence", insert -- on --; and after "extended defects", delete "nucleanon" and insert -- nucleation --.
"L.J. Huang et al." reference, after "Model for blistering", insert -- and splitting --.
"Bruel et al." reference, after "Nuclear", delete "instrument" and insert -- instruments --.
"Lanzieri et al." reference, delete "semi-insulatiing Gaas" and insert -- semi-insulating GaAs --
Insert the following reference:
-- da Silva et al., "The effects of implantation temperature on He bubble formation in silicon," Nuclear Instruments and Methods in Physics Research Section B: Beam Interactions with Materials and Atoms, Vols. 175-177, pp. 335-339 (April 2001). --.
Item [57], ABSTRACT,
Line 5, after "implanted atomic species to", delete "from" and insert -- form --.

Column 9,
Line 55, before "blisters in a surface region", delete "from" and insert -- form --.

Column 10,
Line 53, after "that is implanted comprises hydrogen", delete "of" and insert -- or --.

Signed and Sealed this

First Day of March, 2005

JON W. DUDAS
*Director of the United States Patent and Trademark Office*